(12) United States Patent
Hu et al.

(10) Patent No.: US 7,553,180 B2
(45) Date of Patent: Jun. 30, 2009

(54) LOCKING DEVICE

(75) Inventors: Peixian Hu, Shenzhen (CN); Jianfeng Ma, Shenzhen (CN)

(73) Assignee: Bizlink USA Technology Inc., Fremont, CA (US)

( * ) Notice: Subject to any disclaimer, the term of this patent is extended or adjusted under 35 U.S.C. 154(b) by 32 days.

(21) Appl. No.: 11/950,506

(22) Filed: Dec. 5, 2007

(65) Prior Publication Data

US 2008/0276663 A1 Nov. 13, 2008

(30) Foreign Application Priority Data

May 8, 2007 (CN) .................... 2007 2 0119972 U

(51) Int. Cl.
*H01R 13/627* (2006.01)
(52) U.S. Cl. .................... 439/352; 439/718; 220/326; 220/284
(58) Field of Classification Search ................ 439/352, 439/353, 718; 220/326, 284; 174/138 F
See application file for complete search history.

(56) References Cited

U.S. PATENT DOCUMENTS

| 4,840,286 A | * | 6/1989 | Heberling et al. | .......... | 220/4.02 |
| 5,295,602 A | * | 3/1994 | Swanson | .................... | 220/786 |
| 5,931,514 A | * | 8/1999 | Chung | .......................... | 292/89 |
| 6,412,633 B1 | * | 7/2002 | Costa | ...................... | 206/459.5 |
| 7,413,479 B1 | * | 8/2008 | Volpone | .................... | 439/692 |

* cited by examiner

*Primary Examiner*—Hien Vu
(74) *Attorney, Agent, or Firm*—Grace Lee Huang; Bayshore Patent Group, LLC

(57) ABSTRACT

A locking device attached to a solar junction box and a key to open the locking device, comprises: a male part; comprising: a plug-in unit extended at an angle from the male part; a pair of protruded units having a locking tab formed on edges of the plug-in unit; an outward projection disposed above the locking tab; and a slant portion formed on top of the outward projection; and a female part; comprising: a hollow main body having an outside wall and an inside wall; a pair of extrusions disposed at the inside wall of the female part corresponding to the pair of locking tabs of the male part; and a step formed in the lower part of the extrusions of the female part geometrically shaped to match the locking tab of the male part, in a locked position the male part and the female part are securely clamped together.

7 Claims, 8 Drawing Sheets

LOCKING DEVICE

FIELD OF THE INVENTION

The present invention relates to a locking device and the key thereof associated with the junction box. The junction box can be photovoltaic modules.

BACKGROUND OF THE INVENTION

Several junction boxes with locking means have been disclosed in prior publications, such as U.S. Patent Appl. Ser. No. 2006/0281345. Caswell et al. discloses a self-locking junction box suitable for making wiring connections. However, there are several drawbacks that have limited the functions of securely fastening the junction box. First, in order to lock the junction box, the user has to align the top part of junction box with the lower part thereof, which is inconvenient for workers in a heavy workload environment. Second, the self-lock junction box can not be securely fastened and locked. The engagement of the junction box is only featured by one barb in the top portion with a corresponding barb hole in the bottom portion thereof. By featuring only one locking mechanism, the junction box can later be easily unlocked in certain situations, for example, after repetitive usages. Third, the prior art still requires certain tools, for example, the screw nails in order to lock the self-locking box.

For the conventional locking device associated with the junction box, it usually takes several steps to unlock the device and brings inconveniences to the user. For example, some junction boxes feature a fixed hasp. The hasp has an opening for receiving the shackle of a padlock for locking and engaging the top portion and the bottom portion of the junction box together. To unlock the junction box, the user uses a key to unlock the padlock, take off the padlock from the junction box, and open the top cover of the junction box. The design of the junction box is not user-friendly for the general users.

Another example of the convention locking device featured in the photovoltaic module junction box is provided and described. A top cover of the junction box features four tabs formed thereof, and a bottom portion of the junction box features four openings corresponding to the tabs on the top cover. To release the locked junction box, the user has to find a tool and open each of the four tabs, which is inconvenient and troublesome.

The invention herein overcomes many of the above noted shortcomings.

Accordingly, what is needed in the art is a locking device associated in a junction box which provides user-friendly tasks and secured locking mechanism by featuring a self-locking junction box and a key thereof. The user can unlock the buckle locking device by a simple key.

SUMMARY OF THE INVENTION

A locking device attached to a junction box according to the present invention, comprises: a male part; comprising: a plug-in unit extended at an angle from the male part; a pair of protruded units having a locking tab formed on edges of the plug-in unit; an outward projection disposed above the locking tab; and a slant portion formed on top of the outward projection; and a female part; comprising: a hollow main body having an outside wall and an inside wall; a pair of extrusions disposed at the inside wall of the female part corresponding to the pair of locking tabs of the male part; and a step formed in the lower part of the extrusions of the female part geometrically shaped to match the locking tab of the male part, wherein inserting the male part into the female part, the locking tab of the pair of protruded units of the male part and the step of female part are clamped together at the opposite sides, wherein simultaneously the outward projection of the male part contacts with the proximal end of the extrusion and thereby securely clamping the male part and the female part in a locked position, wherein in a locked position the female part is located between each one of the pair of protruded unit of the male part.

In another embodiment, a locking device according to the present invention, comprises: a male part; comprising: a plug-in unit extended at an angle from the male part; a pair of protruded units having a locking tab formed on edges of the plug-in unit; an outward projection disposed above the locking tab; and a slant portion formed on top of the outward projection; and a female part; comprising: a hollow main body having an outside wall and an inside wall; a pair of extrusions disposed at the inside wall of the female part corresponding to the pair of locking tabs of the male part; and a step formed in the lower part of the extrusions of the female part geometrically shaped to match the locking tab of the male part, wherein inserting the male part into the female part, the locking tab of the pair of protruded units of the male part and the step of female part are clamped together at the opposite sides, wherein simultaneously the outward projection of the male part contacts with the proximal end of the extrusion and thereby securely clamping the male part and the female part in a locked position, wherein in a locked position the female part is located between each one of the pair of protruded unit of the male part.

In another embodiment of the present invention, a combination key for releasing the locking device comprises: a plate having an opening; a protrusion having an inclined portion formed at the plate and extended from thereof; and a pair of tilted hook formed at the plate extended from thereof and disposed beside the protrusion, wherein the pair of tilted hook is inclined toward the plate, and the protrusion having an inclined portion tilted toward the plate, wherein inserting the combination key into the inside wall of the hollow main body of the female part to unlock the locking device, wherein the inclined portion of the protrusion of the key can be pressed toward the slant portion of the outward projection of the male part to allow the outward projection of the male part release from the upper side of the extrusion of the female part, wherein simultaneously inserting the key into the female part creates a vertical pressure forcing the locking tab of the male part out of the extrusion of the female part, wherein the pair of tilted hook therefore clasping corresponding pair of the protruded units of the plug-in unit of the male part, wherein the user pulls out the key from the hollow main body of the female part, the titled hook of the key draws the male part from the hollow main body of the female part.

Accordingly, it is an object of the present invention by featuring a double clamping mechanism for securely fastening and clamping the junction box It is another object of the present invention to securely fasten the junction box without the tools of screws, bolts, or cables to tighten it up.

It is another object of the present invention by providing a pivoting point to properly align and position the engagement of the junction box in a locked position.

It is another object of the present invention by providing a buckle locking device associated in a junction box to securely and easily fasten the junction box.

It is still another object of the present invention by providing a key to easily unlock the buckle locking device associated in a junction box.

DETAILED DESCRIPTION OF THE PREFERRED EMBODIMENT

Figure 1:
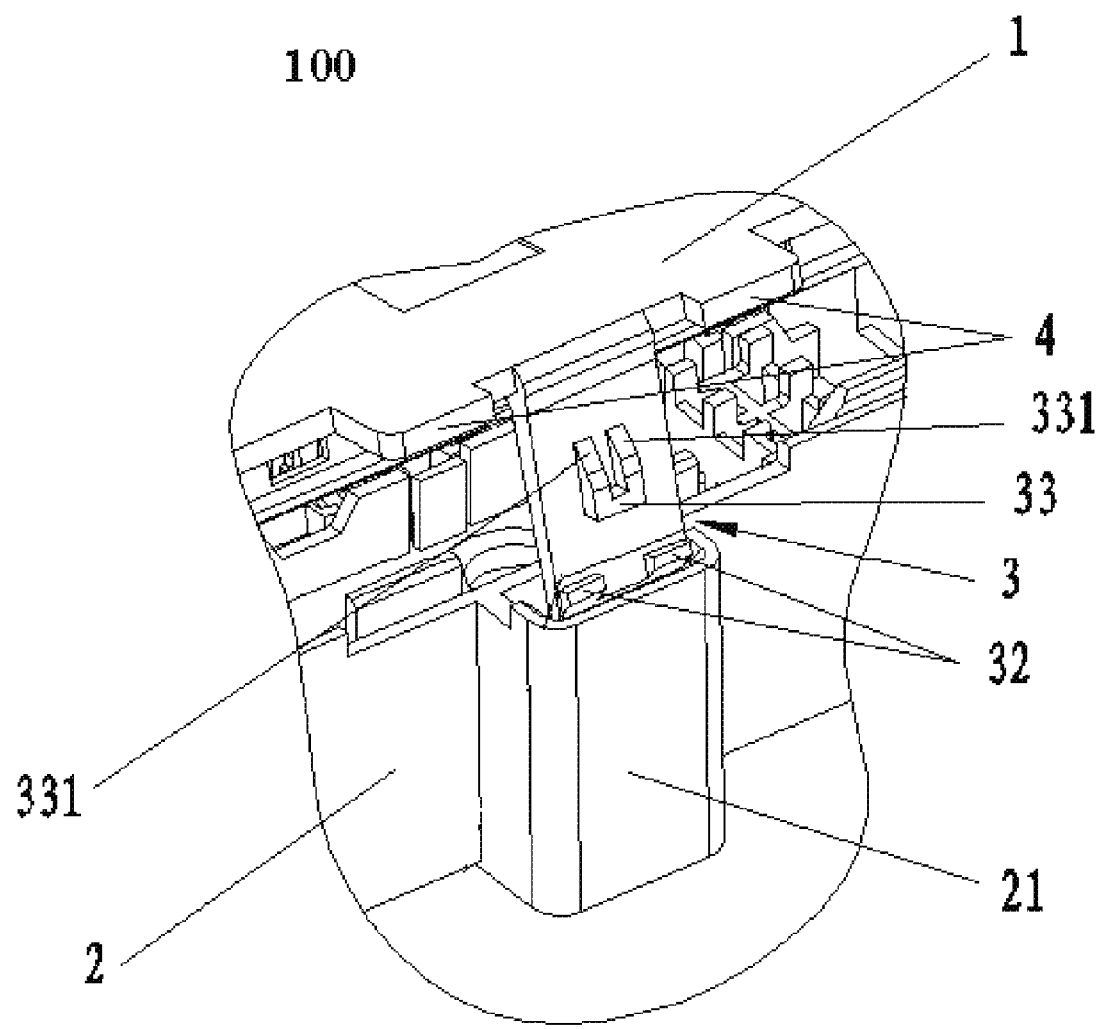
FIG. 1 illustrates a prospective view of the locking device in an unlocked position.

Referring now in detail to the drawings, FIG. 1 illustrates a locking device 100 attached to a junction box, comprising a male part 1 and a female part 2. The junction box can be a solar junction box, such as a photovoltaic junction box. Male part 1 has a plug-in unit 3, and a pair of protruded units 4. The plug-in unit 3 has a pair of locking tabs 32 formed on edges of the plug-in unit 3, an outward projection 33 disposed above the locking tab 32, and a slant portion 331 formed on top of the outward projection 33. The plug-in unit 3 is extended at an angle from the male part 1. In a preferred embodiment, the plug-in unit 3 is extended from the male part 1 at an angle about ninety degrees. As shown in FIG. 1, the outward projection 33 of male part 1 may be provided on an upper end with a slant portion 331 that is tilted toward a plug-in unit 3. A pair of locking tab 32 may be provided at the front side on a lower part of the plug-in unit 331. In FIG. 1, a pair of protruded units 4 is formed at both sides of the plug-in unit 3. Therefore, when the junction box is engaged in a locked position, the female part 2 is located between each one of the pair of protruded unit 4 of the male part 1.

Figure 4:
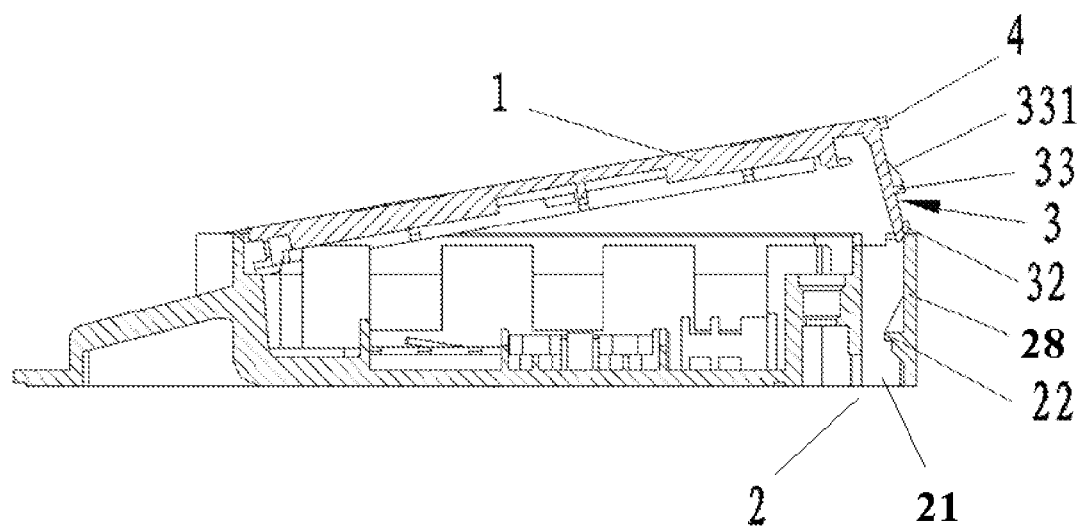
FIG. 4 illustrates a cross-section view of the locking device taken along line E-E in FIG. 3A in a unlocked position.

In FIG. 1 and FIG. 4, the female part 2 has a hollow main body 21. As shown in FIG. 4, a pair of extrusions 22 disposed at inside wall 28 of hollow main body 21 of female part 2 corresponds to the pair of locking tabs 32 of male part 1 in FIG. 1.

Figure 2:
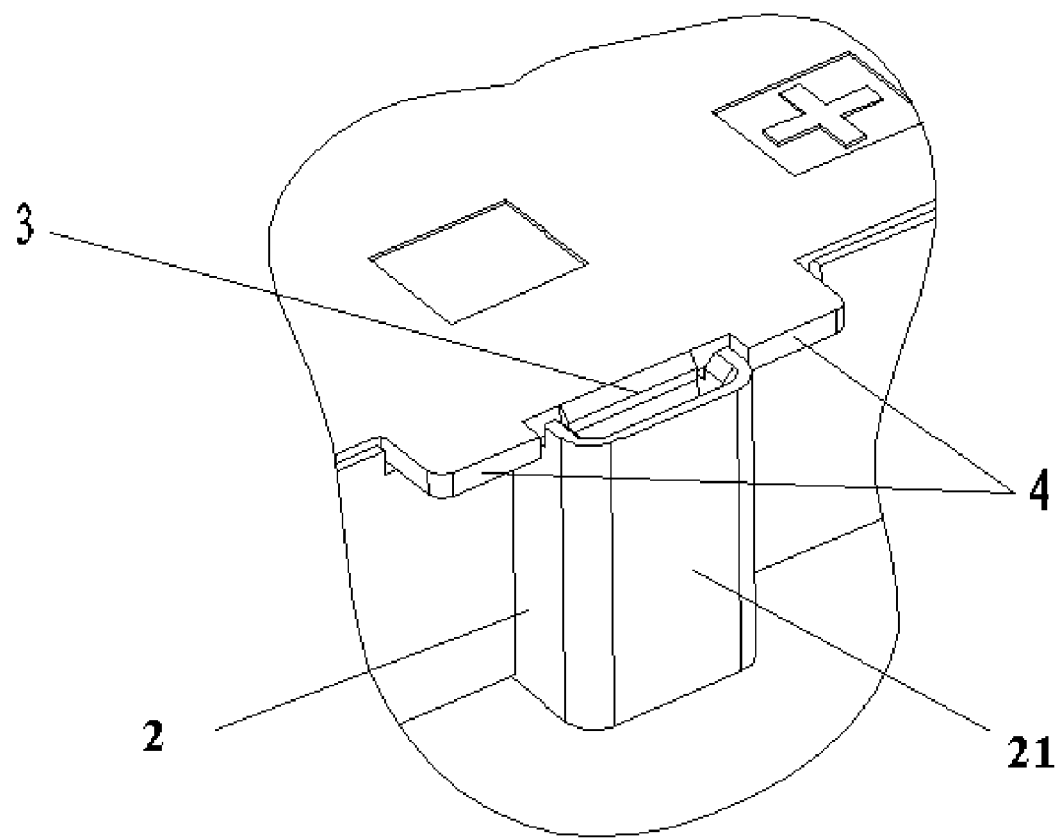
FIG. 2 illustrates a prospective view of the locking device of FIG. 1 in a locked position.

FIG. 2 illustrates the locking device 100 of FIG. 1 in a locked position associated in a junction box 300. As shown in FIG. 1, each of the locking tabs 32 of male part 1 is applied for inserting into each of the corresponding extrusion 22 of the female part 2. As shown in FIG. 4, a step 25 is formed in the lower part of the extrusion 22 of the female part 2. The step 25 is geometrically shaped to match the locking tab 32 of the male part 1 in FIG. 1. Therefore, when the plug-in unit 3 of the male part 1 is inserted into the hollow main body 21 of the female part 2 as shown in FIG. 2, the locking tabs 32 of male part 1 are correspondingly and respectively inserted into the step 25 of the extrusions 22 of female part 2. In the present invention, the locking tab 32 and the step 25 are clamped at the opposite sides when the plug-in unit 3 of the male part 1 is inserted into the hollow main body 21 of the female part 2, thereby forming a locked position of the present invention.

Figure 3A:
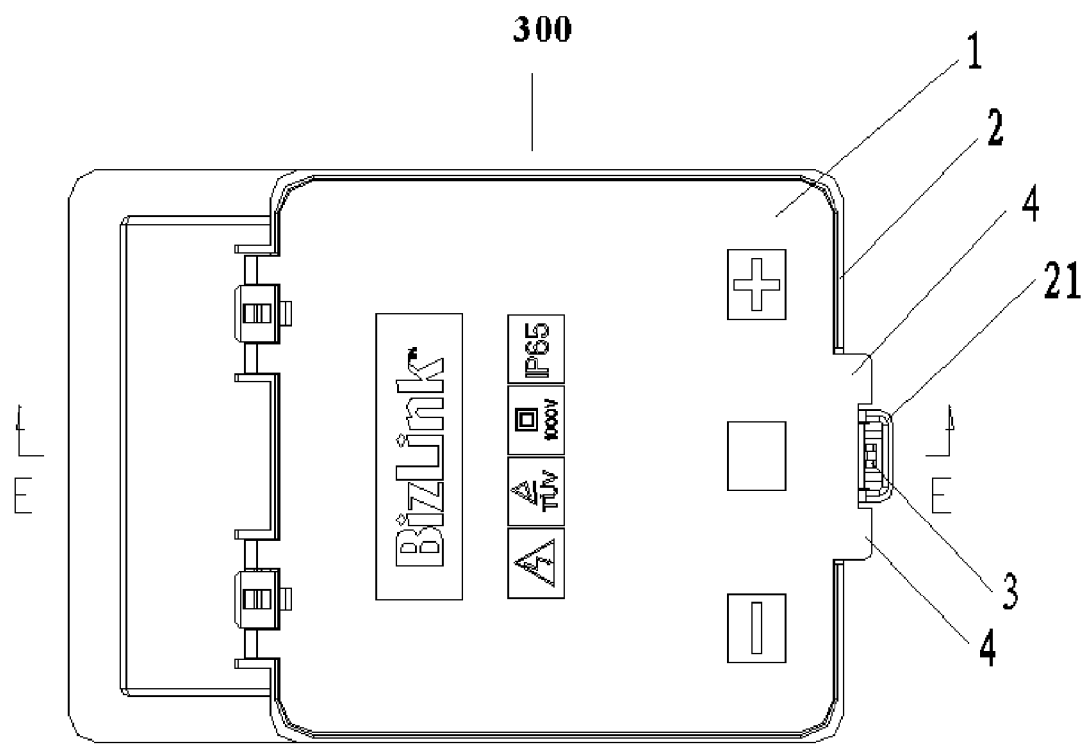
FIG. 3A illustrates a prospective view of one embodiment of the locking device associated in a junction box.
Figure 3B:
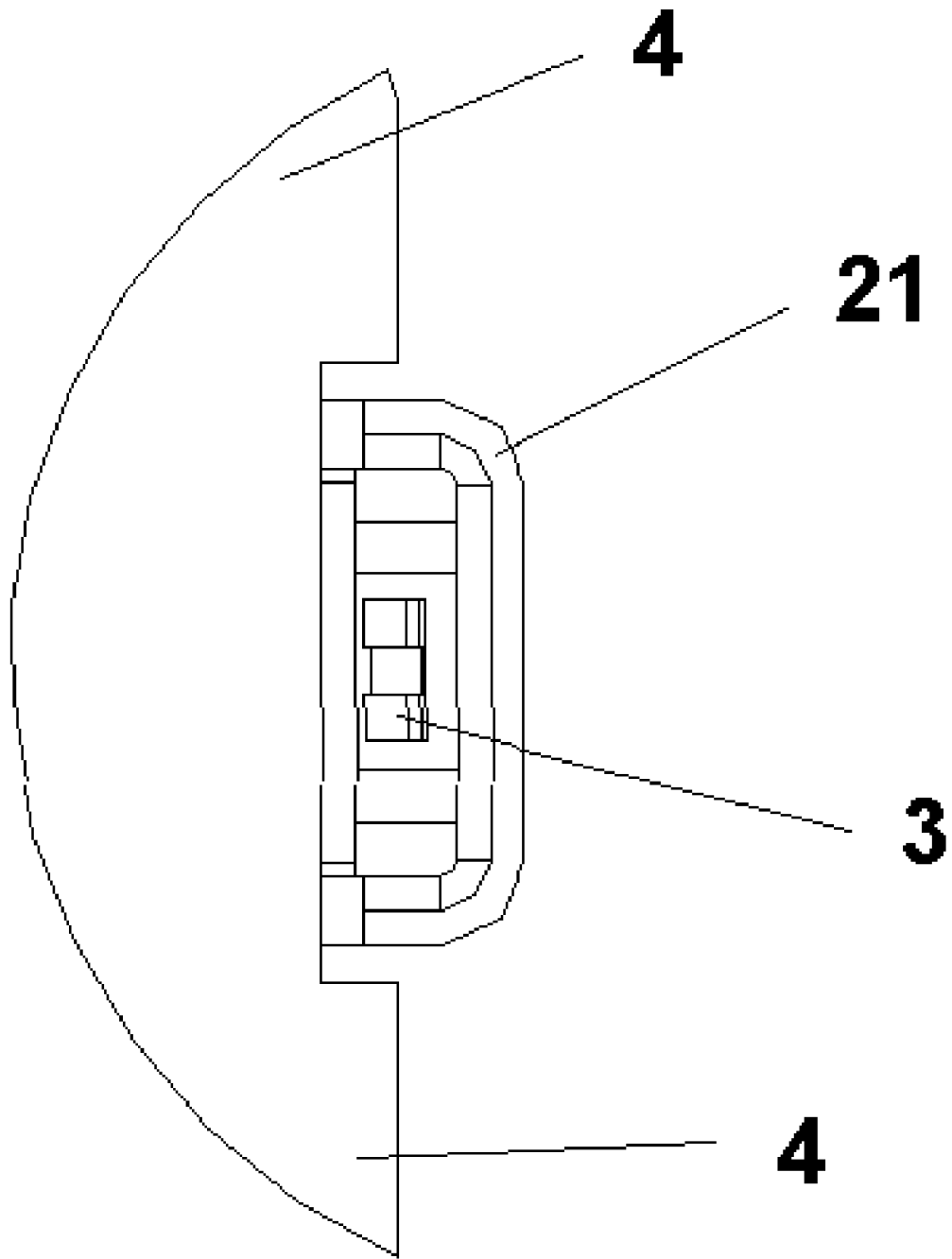
FIG. 3B illustrates an enlarged portion of FIG. 3A.

FIG. 3A illustrates an embodiment of the locking device 100 associated in a junction box 300. FIG. 3B illustrates an enlarged portion of FIG. 3A showing an locking position when the male part 1 is engaged with the female part 2. As described above, the locking device 100 can be formed in a photovoltaic junction box 300, wherein the male part 1 is the top cover, and the female part 2 is box body. In a preferred embodiment, the locking device 100 is in locked position when the top cover of the male part 1 is engaged and locked with the female part 2 of the present invention. In another embodiment, the locking device 100 does not necessarily be attached to the junction box 300.

FIG. 4 illustrates a cross-section view of the locking device 100 in an unlocked position. Male part 1 has a plug-in unit 3, and a pair of protruded units 4. The plug-in unit 3 has a pair of locking tabs 32 formed on edges of the plug-in unit 3, an outward projection 33 disposed above the locking tab 32, and a slant portion 331 formed on top of the outward projection 33,. The pair of locking tab 32 of the present invention is designed to provide a pivoting point for the insertion of the male part 1 onto female part 2. At the beginning of the insertion step, the protruded shape of the locking tab 32 touches the edge of the proximal end 20 of the female part 2, thereby providing a pivoting point for this engagement. The pair of locking tab 32 of the present invention is also served to position and align properly the insertion of male part 1 into female part 2.

As shown in FIG. 4, the locking device 100 of the present invention provides a double clamping mechanism to securely locking and engaging the male part 1 and the female part 2 together in a locked position. The features of the locking tab 32 of male part 1 with the extrusion 22 of female part 2 provide a first clamping mechanism. As shown in FIG.4, the extrusion 22 is an inward projection formed in the inside wall 28 of the female part 2. A step 25 is formed in the lower part of the extrusion 22 of the female part 2. The step 25 is geometrically shaped to match the locking tab 32 of the male part 1. Therefore, when the male part 1 is inserted into the female part 2, the locking tabs 32 of male part 1 are correspondingly and respectively inserted into the step 25 of the extrusions 22 of female part 2. In other words, the locking tab 32 of male part 1 and the step 25 of the extrusions 22 of female part 2 are clamped and fixed at the opposite sides when the plug-in unit 3 of male part 1 is inserted into the hollow main body 21 of female part 2, thereby forming a secured locked position of the present invention. Simultaneously, a second clamping mechanism is provided during the insertion of the male part 1 into female part 2. As shown in FIG. 4, the extrusion 22 of female part 2 has a titled angle toward the inside wall 28. The plug-in unit 3 of male part 1 features the outward projection 33, and a slant portion 331 formed on top of the outward projection 33. When the locking tab 32 and the step 25 of the extrusion 22 are clamped together, the outward projection 33 contacts with the proximal end of extrusion 22. The fixture therefore generates a lateral pressure between the outward projection 33 of male part 1 and the upper side of extrusion 22 of female part 2, thereby securely clamping the male part 1 and the female part 2 in a locked position.

Figure 5:
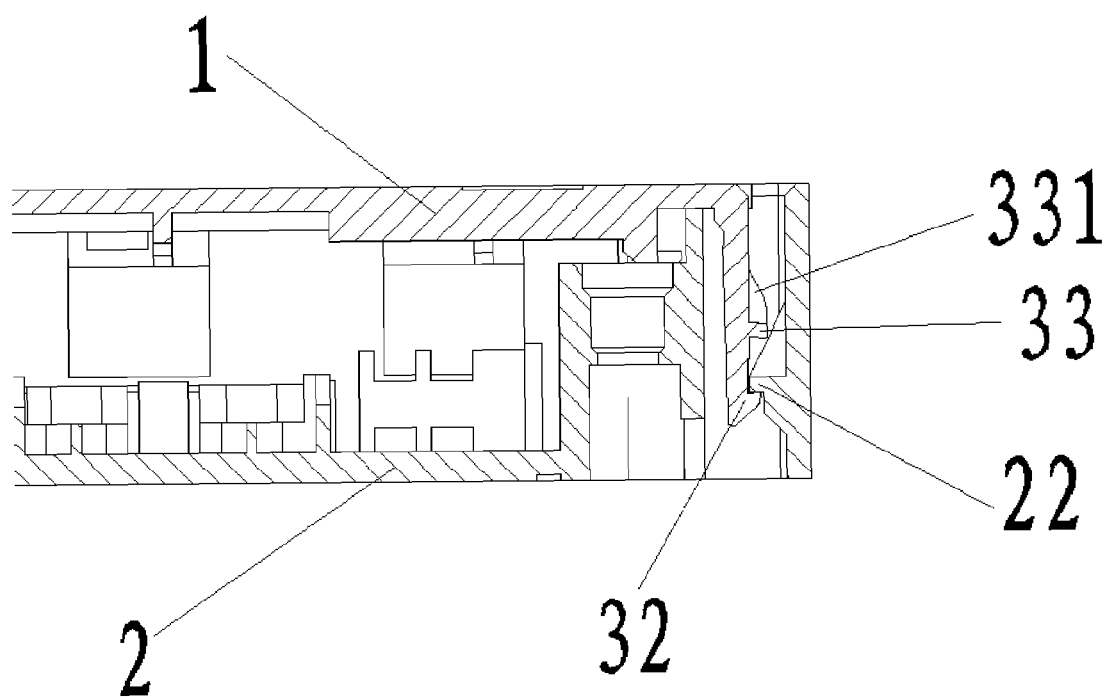
FIG. 5 illustrates a cross-section view of the locking device taken along line E-E in FIG. 3A in a locked position.

FIG. 5 illustrates a cross-section view of the locking device 100 in a locked position. As described above, the locking buckle of the present invention features a pivoting point for aligning and positioning the insertion of the male part 1 into female part 2. Moreover, the present invention provides a double clamping mechanism to securely locking the photovoltaic junction box 300. Therefore, the male part 1 is locked and fully engaged with the female part 2.

Figure 6:
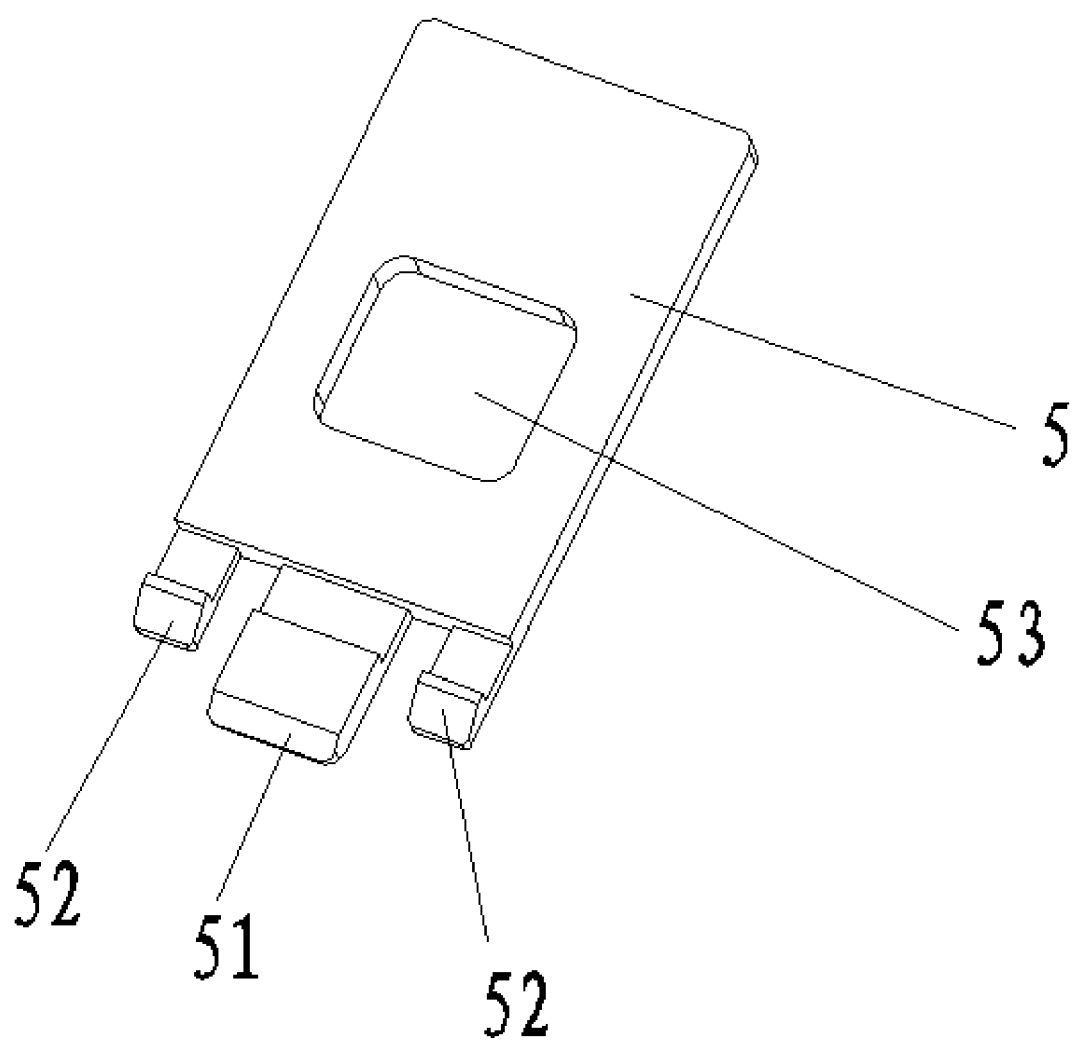
FIG. 6 illustrates a prospective view of one embodiment of the key for releasing the locking device.

FIG. 6 illustrates the combination key 6 of the present invention for releasing the locking device 100 of FIG. 1. The combination key 6 for releasing the locking device 100 comprising a plate 5 having an opening 53, a protrusion 50 formed at plate 5 and extended from thereof, and a pair of tilted hook 52 formed at plate 5 extended from thereof and disposed beside the protrusion 50. The pair of tilted hook 52 is inclined toward the plate 5. The protrusion 50 has an inclined portion 51 that is tilted toward the plate 5. The preferred structural material is injection molding, wherein preferably the plate 5, protrusion 50 and a pair of tilted hook 52 are formed of a single piece unit. In a preferred embodiment, the combination key 6 has a plate shape. In another preferred embodiment, the key 6 is a rectangle plate. In another embodiment, the key 6 is a square plate.

Figure 7:
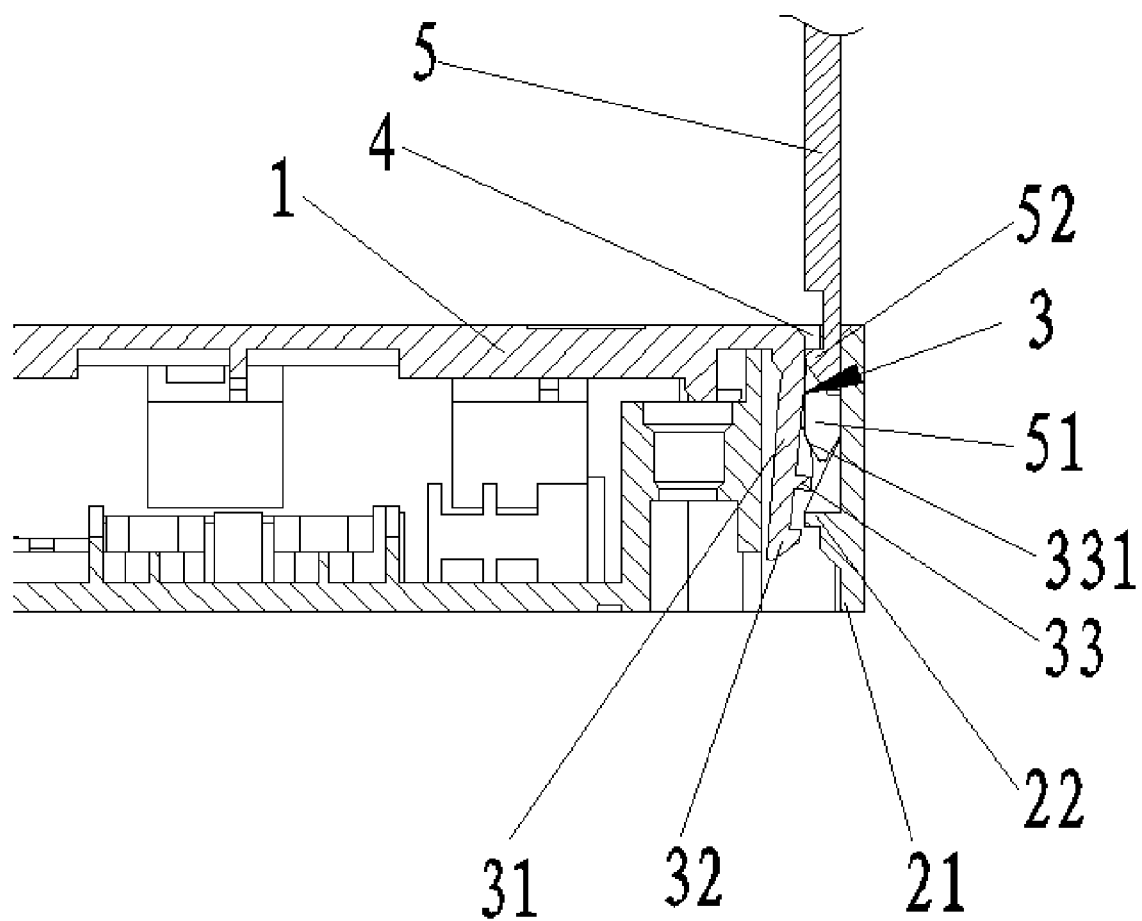
FIG. 7 illustrates a vertical cross-section view of one embodiment of the assembly of the locking device with a key.

FIG. 7 illustrates the locking device 100 of the FIG. 2 being unlocked by a combination key 6. To unlock the junction box 300, the user can insert the combination key 6 into the inside wall 28 of the hollow main body 21 of the female part 2. When the key 6 is inserted into the female part 2, the inclined portion 51 of the protrusion 50 of the combination key 6 can press toward the slant portion 331 of the outward projection 33 of male part 1, thereby generating the lateral and vertical forces to allow the outward projection 33 of male part 1 release from the upper side of extrusion 22 of female part 2. Simultaneously, the insertion of the combination key 6 into the female part 2 creates a vertical force to separate the locking tab 32 of male part 1 from the extrusion 22 of female part 2. In addition to separate the male part 1 from the female part 2, the key 6 provides an easy pull-out mechanism to bring the male part 1 out from the female part 2. After the key 6 is inserted to the hollow main body 21 of the female part 2, the pair of tilted hook 52 of key 6 clasps the corresponding pair of protruded units 4 of plug-in unit 3 for male part 1. When the user pulls out the combination key 6 from the hollow main body 21 of the female part 2, the titled hook 52 of the combination key 6 can draw the male part 1 from the hollow main body 21 of the female part 2. Accordingly, the male part 1 of the junction box 300 can be released from the hollow main body 21 of female part 2 to unlock the locking device 100 of the junction box 300.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed is:

1. A locking device attached to a junction box, comprising:
 a male part comprising: a plug-in unit extended at an angle from said male part;
 a pair of locking tabs formed on side edges of said plug-in unit;
 an outward projection disposed above and between said locking tabs; and
 a slant portion formed on top of said outward projection;
 a pair of protruded units, said plug-in unit positioned in between said pair of protruded units; and
 a female part, comprising:
 a hollow main body having an inside wall;
 a pair of extrusions disposed at said inside wall of said hollow main body corresponding to said pair of locking tabs of said male part when said plug-in unit inserts into said hollow main body; and
 a step formed in the lower part each of said extrusions of said female part geometrically shaped to match each of said locking tabs of said male part,
 wherein inserting said male part into said female part, said locking tabs of said pair of protruded units of said male part and said steps of female part are clamped together at the opposite sides, wherein simultaneously said outward projection of said male part contacts with the proximal end of said extrusions and thereby securely clamping said male part and said female part in a locked position, wherein in a locked position said female part is located between said pair of protruded units of said male part;
 wherein said plug-in unit is a plate;
 wherein said male part and said female part are injection molded single piece units; and
 wherein said device can be formed in a photovoltaic junction box, wherein said male part is the top cover of said junction box, and said female part is said box.

2. The locking device according to claim 1, wherein said plug-in unit is extended from said male part at an angle of about ninety degrees.

3. A locking device, comprising:
 a male part comprising: plug-in unit extended at an angle from said male part;
 a pair of locking tabs formed on side edges of said plug-in unit;
 an outward projection disposed above and between said locking tabs; and
 a slant portion formed on top of said outward projection;
 a pair of protruded units, said plug-in unit positioned in between said pair of protruded units; and
 a female part, comprising:
 a hollow main body having an inside wall;
 a pair of extrusions disposed at said inside wall of said hollow main body corresponding to said pair of locking tabs of said male part when said plug-in unit inserts into said hollow main body; and
 a step formed in the lower part of each of said extrusions of said female part geometrically shaped to match each of said locking tabs of said male part,
 wherein inserting said male part into said female part, said locking tabs of said pair of protruded units of said male part and said steps of female part are clamped together at the opposite sides, wherein simultaneously said outward projection of said male part contacts with the proximal end of said extrusions and thereby securely clamping said male part and said female part in a locked position, wherein in a locked position said female part is located between said pair of protruded units of said male part;
 wherein said plug-in unit is a plate;
 wherein said male part and said female part are injection molded single piece units.

4. The locking device according to claim 3, wherein said plug-in unit is extended from said male part at an angle of about ninety degrees.

5. A combination key for releasing the locking device according to claim 1, comprising:
 a plate having an opening;
 a protrusion having an inclined portion formed at said plate and extended therefrom and;
 a pair of tilted hooks formed at said plate extended therefrom and disposed beside said protrusion,
 wherein said pair of tilted hook is inclined toward said plate, and said protrusion having an inclined portion tilted toward said plate, wherein inserting said combination key into said inside wall of said hollow main body of said female part to unlock said locking buckle device, wherein said inclined portion of said protrusion of said key can be pressed toward said slant portion of said outward projection of said male part to allow said outward projection of said male part release from the upper side of said extrusion of said female part, wherein simultaneously inserting said key into said female part creates a vertical pressure forcing said locking tab of said male part out of said extrusion of said female part, wherein said pair of tilted hook therefore clasping corresponding pair of said protruded units of said plug-in unit of said male part, wherein the user pulls out said key from said hollow main body of said female part, said titled hook of said key draws said male part from said hollow main body of said female part.

6. The combination key according to claim 5, wherein said key is injection molded and the said plate, said protrusion and said pair of tilted hooks are formed of a single piece unit.

7. The combination key according to claim 6, wherein said key is a rectangle plate or a square plate.

* * * * *